(12) United States Patent
Ruckerbauer et al.

(10) Patent No.: US 6,636,097 B2
(45) Date of Patent: Oct. 21, 2003

(54) METHOD AND INPUT CIRCUIT FOR EVALUATING A DATA SIGNAL AT AN INPUT OF A MEMORY COMPONENT

(75) Inventors: Hermann Ruckerbauer, Moos (DE); Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,650

(22) Filed: Jul. 1, 2002

(65) Prior Publication Data

US 2003/0001624 A1 Jan. 2, 2003

(30) Foreign Application Priority Data

Jun. 29, 2001  (DE) .......................................... 101 31 682

(51) Int. Cl.7 ................................................ G06G 7/64
(52) U.S. Cl. ........................................ 327/336; 327/91
(58) Field of Search ................................ 327/336, 344, 327/345, 91, 94–96, 58–62

(56) References Cited

U.S. PATENT DOCUMENTS

| 5,497,119 A | * | 3/1996 | Tedrow et al. ............... 327/344 |
| 5,982,205 A | * | 11/1999 | Vallancourt ................... 327/94 |
| 6,194,934 B1 | * | 2/2001 | Detering ...................... 327/345 |

* cited by examiner

Primary Examiner—Toan Tran
(74) Attorney, Agent, or Firm—Laurence A. Greenberg; Werner H. Stemer; Gregory L. Mayback

(57) ABSTRACT

The invention relates to a method and to an input circuit for evaluating a data item in a data signal at an input of a memory component. The data signal is integrated between a start time and an end time that are specified by a control signal. An integration period between the start time and the end time depends on the frequency of the data signal. The data item is assigned a logic data value based on the result of the integration. The input circuit has a comparator device, an integration device and a switching device. The data signal is first integrated in order to obtain an integration value. The comparator device compares the integration value with a prescribed threshold value. A logic data value is assigned to the data item based on the result of the comparison.

7 Claims, 1 Drawing Sheet

METHOD AND INPUT CIRCUIT FOR EVALUATING A DATA SIGNAL AT AN INPUT OF A MEMORY COMPONENT

BACKGROUND OF THE INVENTION

Field of the Invention

The invention relates to a method and to an input circuit for evaluating a data signal at an input of a memory component.

Data signals such as those that are supplied to a memory component, for example, are subject to interference. As data transfer speeds increase, the reliability for evaluating the data signals is reduced, because even relatively slight interference has a considerable influence on the transfer of the data and can thus result in incorrect evaluating of a data item in a data signal.

Normally, a data item in a data signal is assigned to a data value by measuring a voltage level for the data signal at a particular time and assigning this voltage level to a logic data value. The particular time is generally determined by an edge of a clock signal. If interference occurs in the data signal at the time specified by the edge, an incorrect voltage level for the data signal is measured which differs from the nominal voltage level to a degree such that the measured voltage level is assigned to an incorrect logic data value.

SUMMARY OF THE INVENTION

It is accordingly an object of the invention to provide an input circuit for a memory component and a method for evaluating a data item in a data signal at an input of a memory component which overcome the above-mentioned disadvantages of the prior art apparatus and methods of this general type.

In particular, it is an object of the invention to provide a safe method for evaluating a data signal at an input of a memory component, and to provide an input circuit for a memory component, which can be used to evaluate a data signal reliably.

With the foregoing and other objects in view there is provided, in accordance with the invention, a method for evaluating a data item in a data signal at an input of a memory component. The method includes steps of: obtaining an integration result by integrating the data signal between a start time and an end time; using a control signal to specify the start time and the end time; based on a duration of the data signal, stipulating an integration period between the start time and the end time; and based on the integration result, assigning a logic data value to the data item.

With the foregoing and other objects in view there is also provided, in accordance with the invention, an input circuit for a memory component for evaluating a data item in a data signal. The input circuit includes: a comparator device for obtaining a comparison result; an integration device for obtaining an integration value by integrating the data signal over an integration period based on a length of time that the data item is present; and a switching device for applying the data signal to the integration device. The switching device is connected to the comparator device. The comparator device obtains the comparison result by comparing the integration value with a prescribed threshold value when the integration period has elapsed and the comparator device determines a logic data value for the data item based on the comparison result.

The invention thus evaluates a data item in a data signal not at a firmly prescribed time, as in the case of evaluating methods and evaluating circuits customary to date, but rather integrates the data signal over a predetermined period during which a data item in the data signal is present. The integration reduces the influence of brief interference pulses while the data item is present. The integration result can thus be used to assign a logic data value to the data item.

The advantage of the inventive input circuit is that the data signal is integrated for a predetermined time, so that an integration value is obtained. The influence of brief interference (as compared with the duration of integration), e.g. an interference pulse, on the integration value is comparatively small, so that the inventive input circuit can be used to determine the data value of a data item reliably.

The control signal can be a validity signal that signals the presence of the data item in the data signal at the input. A validity signal is a signal which, during synchronous data transfer, indicates when a data item can be transferred or when the data signal is valid. This indication can be given in relation to a clock signal, for example. Validity signals or clock signals are frequently available at the same time as the data signal, which means that by using the validity signal as a control signal, an additional control signal does not have to be generated. This makes it possible to reduce the circuit complexity.

The integration period can depend on a period for which the data item in the data signal is present. The integration period should not exceed the period for which the data item is present. Otherwise, the data signal would be integrated over a plurality of data items, which would mean that the assignment of a logic data value to a data item were no longer possible or would require considerable complexity.

The data signal can be a double data-rate data signal in line with the double data-rate specification. The first or the second control signal is then a data strobe signal provided for transferring the double data-rate data signal. Particularly in the case of double data-rate data transfers, the high frequency used results in considerable interference that can lead to errors in the data evaluation at an input of the memory component.

Since evaluating the integration value requires that a defined initial state prevail in the integration device before the start of the integration, the integration device can be configured to start integrating the data signal at a particular initial value. To this end, the integration device can have a capacitor that is charged to a particular voltage value when the integration period has elapsed.

The input circuit can have a control input in order to start and end the integration of the data signal. This means that it is possible to use a validity signal or a clock signal available during synchronous data transfer of the data signal to generate control signals for the control input. In this way, control signals having a stipulated timing with respect to the data signal can be obtained.

The control input is preferably connected to a data strobe signal in a double data-rate transfer system. In this way, the data strobe signal controls the duration of integration. Since the data strobe signal is available anyway in a double data-rate transfer system, it is not necessary to generate an additional control signal. This allows the complexity for the input circuit to be reduced, which means that substrate area can be saved in an integrated design.

Other features which are considered as characteristic for the invention are set forth in the appended claims.

Although the invention is illustrated and described herein as embodied in a method and input circuit for evaluating a data signal at an input of a memory component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
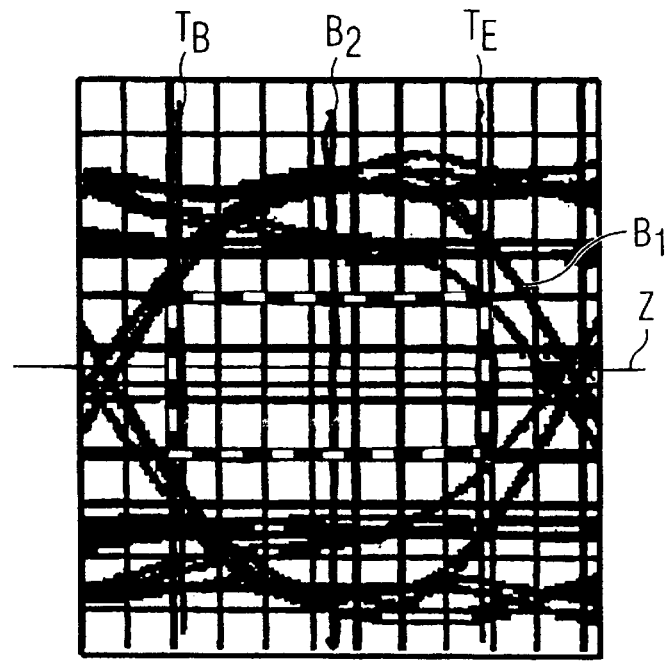
FIG. 1 is an eye diagram of a data signal.

Referring now to the figures of the drawing in detail and first, particularly, to FIG. 1 thereof, there is shown an eye diagram in which the data within the dashed rectangle B1 are valid. To observe setup and hold times for a conventional input circuit, the optimum time for sampling the data in the case of the conventional evaluating methods is approximately in the center of this rectangle B1, which is indicated by the vertical line B2. If interference acts on the data signal at the time indicated by the line B2, then there is the risk that the data item will be evaluateed incorrectly.

If, however, the data signal is integrated within the rectangle B1 in line with the invention, then brief interference, e.g. an interference pulse, can exert only a slight influence on the integration result. This applies if the duration of the interference pulse is considerably shorter than the total integration period, e.g. half or 10% of the integration period.

According to the inventive method, the integration is started at a start time. The start time is chosen such that the data item in the data signal is present during the start time. The start time is indicated in FIG. 1 by the line $T_B$ and is essentially at the start of the data eye which represents the data item in the data signal. Integration is performed up to a time $T_E$, which is shown by the further vertical line $T_E$. Integration is performed for a mean value of the data signal or a threshold value, shown by the horizontal line Z. If the instantaneous data value of the data signal is above this line Z, the integration value rises; if the instantaneous data value is below the line Z, the integration value falls.

Figure 2:
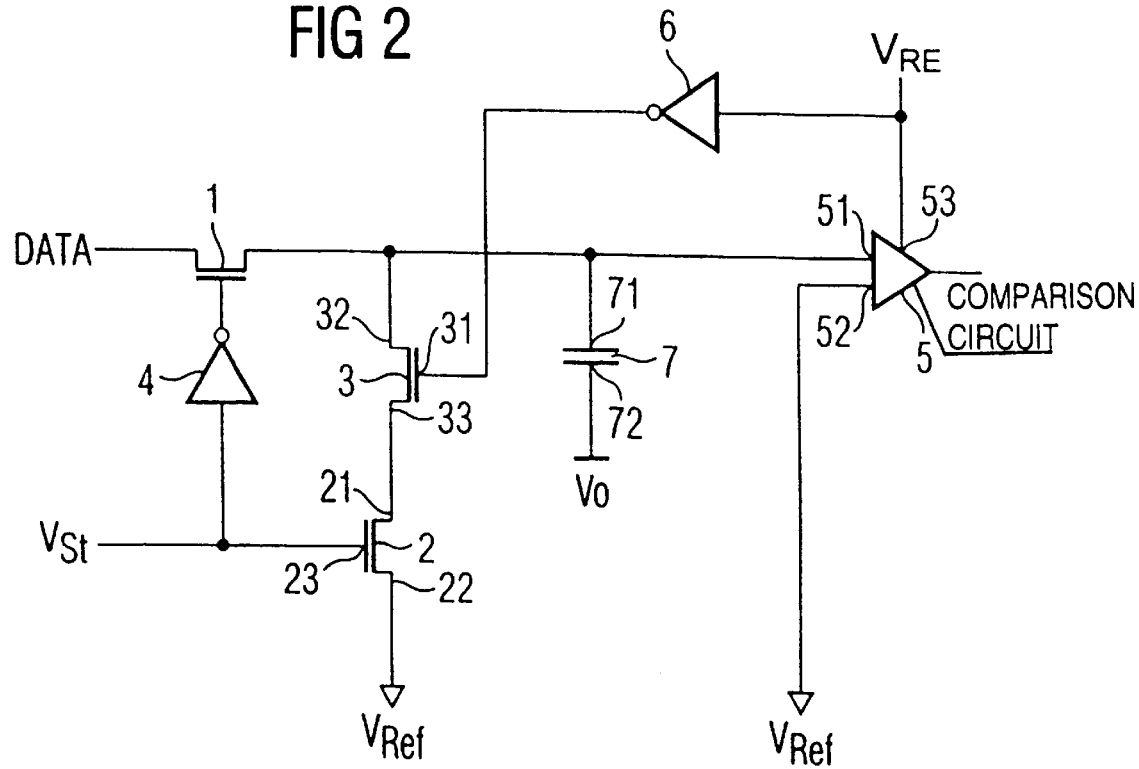
FIG. 2 is a schematic diagram of a preferred embodiment of an input circuit.

FIG. 2 shows an input circuit for a memory component for evaluating a data signal. A data signal DATA is integrated using a capacitor 7. The capacitor 7 is connected to the data signal DATA at a start time and is isolated from the data signal DATA at a stop time. To this end, the data signal DATA is connected to a first connection 71 of the capacitor 7 via a first transistor 1 operated as a switch. A second connection 72 of the capacitor 7 is connected to a fixed potential $V_0$, e.g. to ground.

A control voltage $V_{St}$ is applied to the control input of the first transistor 1 via an inverter 4. The control voltage $V_{St}$ is preferably a digital signal, with the first transistor 1 being off at a low level of the control voltage $V_{St}$.

The first connection of the capacitor 7 is also connected to a first input 51 of a comparison circuit 5. A reference voltage $V_{Ref}$ is applied to a second input 52 of the comparison circuit 5. The comparison circuit 5 compares the voltages present at the first input 51 and at the second input 52 and outputs a logic data value according to the polarity of the voltage difference between the voltage at the first input 51 and the voltage at the second input 52.

The comparison circuit 5 has a control input 53 to which a received switching signal $V_{Re}$ is applied. If $V_{Re}$ has the logic data value of a logic "1", then the comparison circuit 5 has been activated; if $V_{Re}$ has the data value "0", then the comparison circuit 5 is off. The signal $V_{Re}$ is likewise connected to a control input 31 of a transistor 3 via an inverter 6. A first input 32 of the third transistor 3 is connected to the first input 71 of the capacitor 7, and a second input 33 of the third transistor 3 is connected to a first input 21 of a second transistor 2. A second input 22 of the second transistor 2 is connected to a reference voltage $V_{Ref}$, which preferably corresponds to the reference voltage $V_{Ref}$ which is on the comparison circuit 5. The control voltage $V_{St}$ is applied to a control input 23 of the second transistor 2.

The control signal $V_{St}$ is used to switch the data signal at a first time such that it is applied to the first input 71 of the capacitor 7. At the same time, the second transistor 2 has been turned off by the control signal $V_{St}$, which means that no charge can-flow away via the second and third transistors 2 and 3 against the reference voltage $V_{Ref}$. The comparator control signal $V_{Re}$ has been switched such that the comparator circuit 5 is off and the transistor 3 is on.

To end integration at the stop time, a change in the control signal $V_{St}$ turns the first transistor 1 off and turns the second transistor 2 on. A change in the comparator control signal $V_{Re}$ is used to turn on the comparison circuit 5 and at the same time to turn off the transistor 3 via the control input 31. To ensure that the second transistor 2 and the third transistor 3 are not off at the same time, the change in the control signal $V_{St}$ is applied with a slight time delay with respect to $V_{Re}$. If the comparison is carried out in the comparison circuit 5 and the data value produced there is transferred to the subsequent circuit, e.g. a latch, then the comparison circuit 5 is turned off by the comparison control signal $V_{Re}$, and at the same time the third transistor 3 is turned on. At this time, the second and third transistors 2 and 3 are on, which means that the first connection 71 of the capacitor 7 is connected to the reference voltage $V_{Ref}$. This precharges the capacitor 7 to the reference voltage $V_{Ref}$ until, as indicated by the control voltage $V_{St}$, the second transistor 2 is turned off and the data signal DATA is applied to the capacitor 7 again via the first transistor 1. At this initial time, the capacitor 7 has basically been precharged to the reference voltage $V_{Ref}$.

The control signal $V_{St}$ can essentially be derived from a clock signal with which the data signal is synchronous. This can be done, by way of example, using suitably dimensioned delay elements (not shown) which are connected such that the control signal assumes a logic "0" at the start of a present data item in the data signal and changes to a logic "1" shortly before the next data item in the data signal is applied. The comparison control signal $V_{Re}$ is designed such that it essentially turns on the comparison circuit 5 when the control signal $V_{St}$ assumes a logic "1". However, the comparator control signal $V_{Re}$ remains in this state only until the integration value has been compared with the reference voltage $V_{Ref}$ and it has been possible to transfer the result to a subsequent circuit, e.g. to the latch.

Immediately after the result of the comparison has been transferred, the comparison circuit 5 is turned off again by the comparator control signal $V_{Re}$, and this results in the third transistor 3 being turned on, so that the capacitor 7 can be charged to a prescribed initial value. Charging to the initial state ends when the data signal is applied to the first connection 71 of the capacitor 7 via the first transistor 1, so that the second transistor 2 is turned off.

The second connection of the capacitor 7 can also be connected to $V_{Ref}$ instead of to $V_0$, which eliminates the necessity of providing the voltage $V_0$. This allows the number of voltage sources needed to be reduced.

The integration time is essentially determined by the capacitance of the capacitor 7 and by the conductor and forward resistances, so that integration is carried out by an RC element. The resistance values and the capacitance value indicate the integration speed, which allows the sensitivity of the input circuit to be stipulated, for example.

The features of the invention that are disclosed in the description above, and in the drawings can be significant both individually and in any desired combination for the purpose of implementing the invention in its various embodiments.

We claim:

1. A method for evaluating a data item in a double data-rate data signal at an input of a memory component, the method which comprises:

obtaining an integration result by integrating the double data-rate data signal between a start time and an end time;

using a control signal to specify the start time and the end time, the control signal being a data strobe signal provided for transferring the double data-rate data signal;

based on a duration of the data signal, stipulating an integration period between the start time and the end time; and based on the integration result, assigning a logic data value to the data item.

2. The method according to claim 1, wherein: the control signal is a validity signal indicating that the double data-rate data signal is present at the input.

3. The method according to claim 1, wherein: the integration period substantially corresponds to a period during which the data item in the double data-rate data signal is present.

4. A circuit configuration for evaluating a data item in a double data-rate data signal at an input of a memory component, comprising:

an input circuit configured for:

obtaining an integration result by integrating the double data-rate data signal between a start time and an end time, using a control signal to specify the start time and the end time, said control signal being a data strobe signal provided for transferring the double data-rate data signal, based on a duration of the data signal, stipulating an integration period between the start time and the end time, and based on the integration result, assigning a logic data value to the data item.

5. An input circuit for a memory component for evaluating a data item in a double data-rate data signal, comprising:

a comparator device for obtaining a comparison result;

an integration device for obtaining an integration value by integrating the double data-rate data signal over an integration period based on a length of time that the data item is present;

a control input for receiving a control signal specifying a beginning of the integration period and an ending of the integration period, said control signal being a data strobe signal in a double data-rate transfer system; and a switching device for applying the double data-rate data signal to said integration device, said switching device being connected to said comparator device;

said comparator device obtaining the comparison result by comparing the integration value with a prescribed threshold value when the integration period has elapsed and said comparator device determining a logic data value for the data item based on the comparison result.

6. The input circuit according to claim 5, wherein: said integration device is constructed to start integrating the double data-rate data signal at a determined initial value.

7. The input circuit according to claim 5, wherein: said integration device has a capacitor.

* * * * *